United States Patent
Permingeat

(10) Patent No.: US 6,306,240 B1
(45) Date of Patent: Oct. 23, 2001

(54) METHOD FOR MAKING SMART CARDS, AND RESULTING CARDS

(75) Inventor: Vincent Permingeat, Marseilles (FR)

(73) Assignee: Gemplus, Gemenos (FR)

( * ) Notice: Subject to any disclaimer, the term of this patent is extended or adjusted under 35 U.S.C. 154(b) by 0 days.

(21) Appl. No.: 09/230,851

(22) PCT Filed: Aug. 5, 1996

(86) PCT No.: PCT/FR96/01245

§ 371 Date: Mar. 4, 1999

§ 102(e) Date: Mar. 4, 1999

(87) PCT Pub. No.: WO98/06061

PCT Pub. Date: Feb. 12, 1998

(51) Int. Cl.$^7$ .............................................. G06K 19/077
(52) U.S. Cl. ..................... 156/291; 156/295; 156/323; 361/737
(58) Field of Search .................................. 156/290, 291, 156/295, 299, 297, 323; 361/737

(56) References Cited

U.S. PATENT DOCUMENTS

| | | | | |
|---|---|---|---|---|
| 2,768,109 | * | 1/1956 | Coover ................................... | 154/133 |
| 4,196,271 | * | 4/1980 | Yamada et al. ......................... | 525/42 |
| 4,450,024 | * | 5/1984 | Haghiri-Tehrani et al. ......... | 156/108 |
| 4,803,124 | * | 2/1989 | Kunz ...................................... | 428/200 |
| 5,580,410 | * | 12/1996 | Johnston ............................... | 156/240 |

FOREIGN PATENT DOCUMENTS

| | | | | |
|---|---|---|---|---|
| 449691 A | * | 12/1991 | (EP) | . |
| 585949 A | * | 3/1994 | (EP) | . |
| 623897 A | * | 11/1994 | (EP) | . |
| 2613510 A | * | 10/1988 | (FR) | . |
| 09048190 A | * | 8/1995 | (JP) | . |

OTHER PUBLICATIONS

Electronique Radio Plans, No. 535, Jun. 1992, pp. 50–52. Gueulle, Patrick.: "La Fabrication des cartes a puces chez gemplus".*

* cited by examiner

Primary Examiner—Steven D. Maki
Assistant Examiner—John T. Haran
(74) Attorney, Agent, or Firm—John D. Upham; Roland Plottel

(57) ABSTRACT

A method for making cards with an electronic module is disclosed. The method comprises the steps of providing a card body (1) having a cavity (3, 4), an electronic module (5) shaped to fit said cavity, and a cyanoacrylate adhesive, depositing said adhesive in said cavity, inserting said module into the cavity in a substantially centered position, and pressing said adhesive between the card and the module. According to the method, said adhesive is deposited in an amount sufficient to cover an adhesion surface constituting 50–100% of the surface of said cavity, after pressing, at a temperature of 15–30° C. and at a humidity level of 50–75%. The cards produced by carrying out the method are also disclosed.

13 Claims, 3 Drawing Sheets

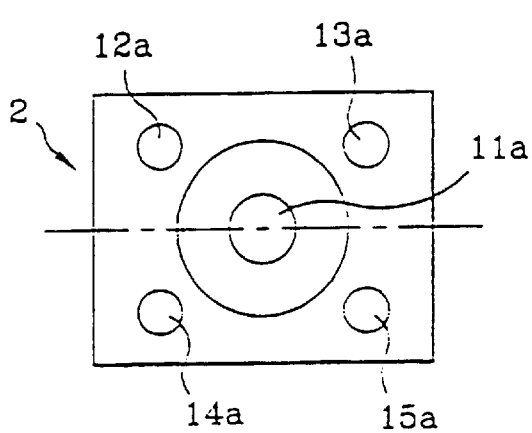
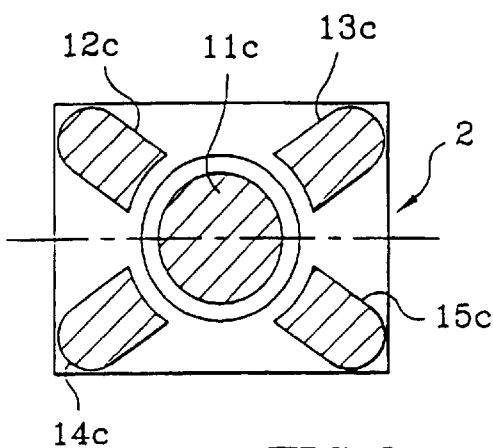
FIG.5  FIG.6
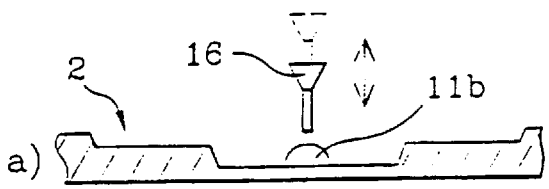
FIG.7
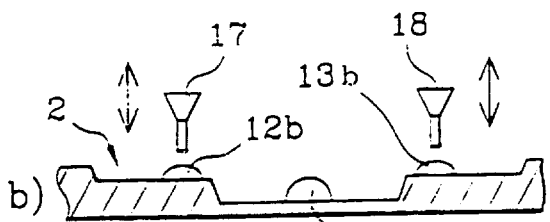
FIG.8
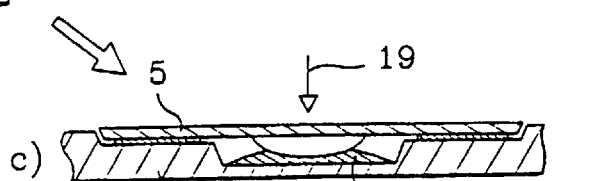
FIG.9
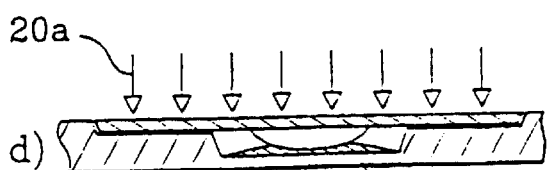
FIG.10
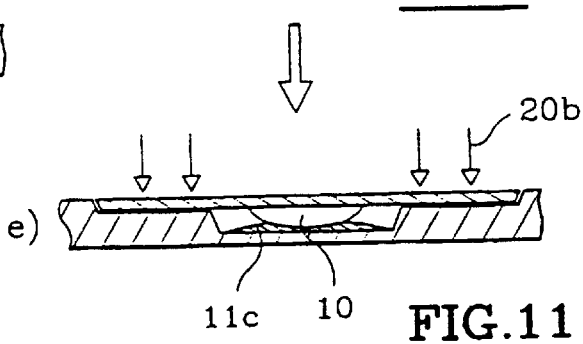
FIG.11

METHOD FOR MAKING SMART CARDS, AND RESULTING CARDS

The present invention relates to a method for making smart cards, of the type having a card body and an electronic module, and cards obtained by implementing the method.

Of the existing methods, a method is known of furnishing a card body with a cavity, an electronic module having principally contact pads and a semiconductor chip containing an integrated circuit, and of securing the electronic module in the cavity with gluing means such as a cyanoacrylate glue. In general, the gluing operation is divided into a prior operation in which the module is inserted into the cavity, and a pressing operation of a is predetermined length.

However, practical implementation of such a method, usually called "encartage" in French, on an automated industrial scale, which requires separate sequenced operations carried out at different stations, and transferring cards from one station to the next at high speed, on the order of several thousand cards an hour, leads to various problems affecting the quality of the finished product.

In particular, it has been found that the cards obtained by gluing using the operations listed above often have major drawbacks.

The principal drawback is incorrect centering of the module in the cavity. Despite correctly centered insertion of the module in the cavity, it has been found that after gluing some modules were off-center, i.e. had shifted from their initial insertion position. Typically, incorrect centering was slight rotation, or translation, or both at the same time inside the cavity, or in extreme cases outside the cavity with the contact pads having one edge overlapping the surface of the card body.

It has been found that the incorrect centering results in particular from forces produced on the card while it was being moved from one station to another, particularly sudden acceleration or deceleration forces brought about by the card leaving the insertion station and stopping at the pressing station, respectively.

Incorrect centering can also result from residual constraints present in the module which tend to produce a slight upward curvature. In this case, there is a risk of the module popping out of the cavity with each acceleration or deceleration referred to above.

Defects relating to poor adhesion of the module to the card body have also been found. In these situations, the card cannot meet the mechanical strength criteria imposed by current standards (ISO and AFNOR) for bending, twisting, and separating forces.

It is accordingly necessary to solve these problems without decreasing production rates.

The present invention relates to a method of gluing an electronic module into a card body that can be compatible with automated very-high-speed industrial production without thereby generating defects involving module centering or adhesion.

For this purpose, the present invention relates to a method for making electronic module cards of the type having a card body with a cavity, an electronic module whose dimensions match the cavity, and a glue of the cyanoacrylate type, and having steps wherein the gluing means are deposited in the cavity, the module is inserted into the cavity in a substantially centered position, and the glue is pressed between the card and the module.

The method is characterized in that the glue is deposited in a quantity enabling a gluing area of between 50 and 100% of the area of the cavity to be covered, after pressing, at a temperature of 15 to 30° C. and a relative humidity of 50 to 75%.

Because of these provisions, the method is defined in terms of environmental conditions that could be compatible with high-speed industrial implementation. The defects of poor glue adhesion and risks of fouling the dispensing means, and the risks of static electricity explained below, are avoided in particular.

The quantity of glue satisfies the requirement of having a sufficient adhesion area to meet the mechanical strength criteria referred to above, and the requirement of holding the module sufficiently firmly when subjected to forces tending to push it off-center while it is being transferred or until the glue is pressed.

Better results can be obtained when the above area is between 60 and 80%, the temperature is between 18 and 24° C., and the relative humidity is between 50 and 75%.

The quality of gluing can be improved while ensuring satisfactory module holding when the above area is approximately 70%, the temperature is approximately 20° C., and the relative humidity is approximately 55%. Under these conditions, the glue used has an open time of approximately 60 seconds.

According to another characteristic, the method had an additional step in which the lower surface of the module is moistened with alcohol prior to being inserted into the cavity.

The purpose of this feature is to artificially create points of adhesion of the cyanoacrylate glue to the module, enabling it to better maintain its centered position while being transferred from one station to another at high speed.

According to another characteristic, the module is inserted in a time of 300 to 600 ms.

This time allows the glue to create still more points of adhesion to the lateral surface of the module for better maintenance of its centered position during transfer. In this way, the method according to the invention allows glue to be deposited at very high but fully controlled rates.

According to another preferred characteristic, the glue is disposed in the form of at least five glue dots, a central dot composed of a drop known as central drop weighing between 0.002 and 0.004 gram, and four lateral dots, each lateral dot composed of a drop weighing between 0.0005 and 0.0015 gram.

These values give the module a good hold while it is being transferred. Also, deposition in this form rather than another form, for example a bead in the same quantity, has been shown to be faster. For optimum holding, these values are approximately 0.003 and 0.001 gram respectively.

Better gluing quality is obtained when the four lateral glue dots are deposited after the central dot is deposited.

According to another characteristic, the method carries out the final pressing with pressing means that apply pressure only to the periphery of the contact pads.

Due to this arrangement, the pressure necessary for obtaining a given glue thickness can be applied and good-quality module adhesion can be created with no risk of creating pressure strains in the semiconductor chip, that could damage it.

The present invention also relates to an electronic module card obtained according to the above method.

Other characteristics and advantages of the invention will emerge more clearly by reading the description hereinbelow of two principal embodiments provided solely as examples. It should be read with reference to the attached drawing wherein:

FIG. 5 is a diagram of a cavity viewed from above with a trace for depositing glue dots;

FIG. 6 represents the adhesion areas of the gluing means on the cavity after pressing;

FIGS. 7 to 11 represent the various steps of the process, or the various operating stations of a system;

The method of making smart cards requires provision of a card body with a cavity and an electronic module whose dimensions match those of the cavity.

Figure 1:
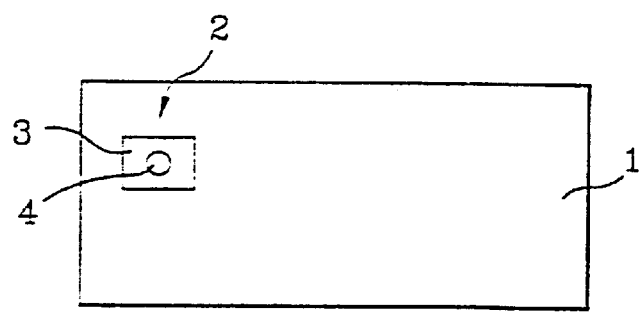
FIG. 1 represents a card body that can be used in the method of the invention.

FIG. 1 shows an example of a smart card 1 that can be used by the method. It has a cavity 2 that can be obtained by casting at the same time as the card body, or by machining.

Card bodies of this type are standardized by ISO and AFNOR, and accordingly have predetermined dimensions.

Figure 4:
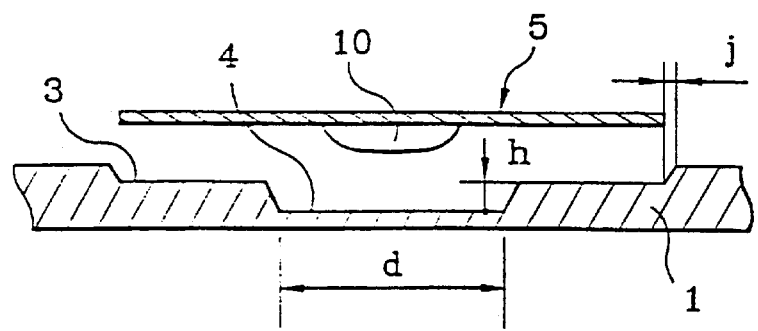
FIG. 4 is a schematic view showing the arrangement of the module relative to the card.

The cavity must accommodate the module. It can thus have shapes that vary according to the module used. In this example it is composed of two hollows: a first hollow 3 of generally rectangular shape terminating at the front surface of the card, and a second hollow 4 of generally circular shape, deeper than the first, disposed in the center of the rectangle and terminating at the bottom of the first hollow. The second hollow has a diameter d of 8.2 mm and a height h of 0.6 mm (FIG. 4).

The material used, generally plastic, depends on the applications. Thus, for example, telephone cards are made of ABS (acrylonitrile butadiene styrene), but can also be made of PVC (polyvinyl chloride), or laminated with polycarbonate (PC), for example PC/ABS or PC/PVC.

In the example, a cavity according to the ISO standard is used, and ABS is used for the material of the card body.

Figure 2:
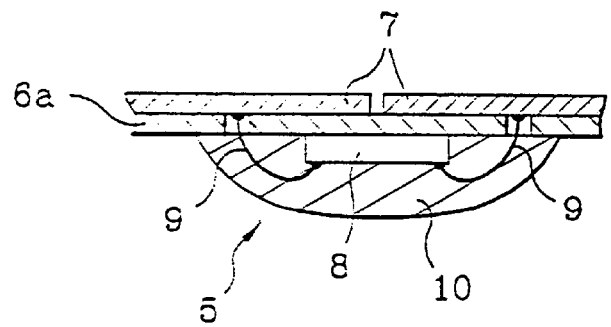
FIG. 2 represents an electronic module that can be used in the method of the invention.
Figure 3:
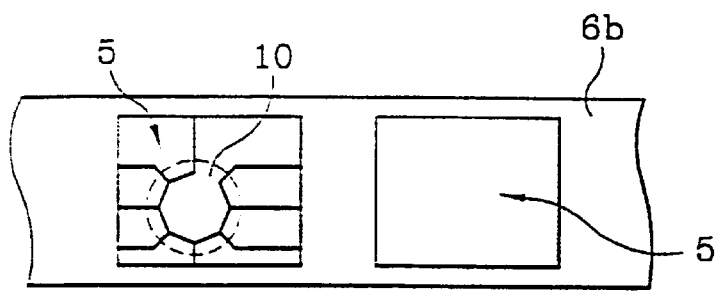
FIG. 3 is a top view of an electronic module backing film.

The electronic module 5 (FIGS. 2 and 3) generally has a backing film 6a made of synthetic insulating material, contact pads 7 made of conducting material, a silicon chip 8 containing an integrated circuit, leads 9 connecting the chip to the contact pads, and a coating resin 10 covering the chip and the connecting leads.

The coating, generally thermosetting epoxy resin, forms an elevation that may have irregular dimensions, particularly of thickness. In the best case, this elevation can be milled smooth to a more precise thickness to facilitate the operation of gluing the module into the card body. Preferably, the goal of the invention is to use the elevation directly without milling.

The module (FIGS. 2 and 3) may be of several types, for example of the laminated leadframe type with a backing film made of polyimide or another type having an epoxy backing film.

In the example, the module is of the laminated leadframe type and thus has a lower polyimide surface. It is supplied from a continuous film 6b (FIG. 3) and presented on a roll.

The cavity of the card is designed to receive the module as shown schematically in FIG. 4. For this purpose, hollow 4 is associated with elevation 10, while hollow 3 is associated with contact pads with the necessary assembly play (J). This play is such that a simple rotation of the module in the plane of the card or translation in this same plane can be detected with the naked eye and is hence a centering defect.

According to the invention, the method also supplies a cyanoacrylate glue.

Its nature can vary according in particular to the quantity of accelerator it contains. Preferably, to ensure good gluing, the glue must be as pure as possible and polymerize as slowly as possible. However, it has been found that the glue must not polymerize too slowly under the operating conditions used if the module is to adhere and hold in the centered position.

It was found that if the quantity was too high there was a risk of overflow. In addition, the glue did not hold the module firmly enough for it to be transferred.

Hence, both the type of cyanoacrylate glue and the quantity and ambient environmental conditions have been determined such that the module can be held in place during high-speed industrial production.

A good compromise between the ability of the glue to hold the module in place and withstand separation and bending/twisting forces was achieved with a glue having an open time of between approximately 30 and 60 seconds under environmental conditions and in quantities corresponding to the broadest value ranges of the example. By definition, the open time of a glue is the time during which the glue is still able to adhere. An optimum compromise for all these values was found with a glue having an open time of approximately 30 seconds. Such a cyanoacrylate glue is available under the Henkel trademark, number 8400.

According to the invention, the method has the following steps: the cyanoacrylate glue is deposited in the cavity, the module is inserted into the cavity in a substantially centered position, and a pressure that tends to apply the module to the card to press the glue is maintained. These steps will be described below in detail in an embodiment illustrated in FIGS. 7 to 11.

According to the method of the invention, the cyanoacrylate glue is deposited in a quantity allowing a gluing area of between 50 and 100% of the flat area of the cavity to be covered after pressing, at a temperature between 15 and 30° C., and a relative humidity of 50 to 75%.

Better results were obtained when a gluing area of 60 to 80%, a temperature of 18 to 24° C., and a relative humidity of 50 to 75% were used.

FIG. 6 shows a cavity with the prints left by the glue after pressing. The glue is spread such that the print left by each lateral glue dot covers a semicircular area 12c to 15c in the general shape of a U which extends substantially radially from near the edge of the second hollow 4 to near the corner delimited by the rectangle formed by the first hollow, with the base of the U pointing to the corner. The print left by the central dot has a circular area 11c.

Thus, with gluing areas as defined by these print shapes and with the above proportions, sufficient adhesion is obtained for the module to withstand the stresses imposed by the standards referred to above.

In the example, values for sufficient module holding and optimum gluing quality were used: the glue was deposited in a quantity covering 70% of the area of the cavity, namely the rectangle of FIG. 6, at a temperature of 20° C. and a relative humidity of 55%. Pressing is done so that the glue thickness is minimized. Good results were obtained with a post-pressing thickness of 0.01 to 0.03 mm. In the example, a thickness of 0.02 mm was obtained. For these precise values, the open time of the glue is then in the upper part of the 30 to 60 second range, with approximately 60 seconds being optimal.

Conversely, optimum module holding and satisfactory gluing quantity can be obtained by selecting a cyanoacrylate glue having an open time in the lower part of the 30 to 60 second range, for example 30 seconds, keeping the same values as above for the other parameters.

As far as the environmental operating conditions for cyanoacrylate glue are concerned, it has been found that when the temperature and relative humidity are too low, polymerization of the glue is too slow, with the risk that the module will peel off and be displaced from the center (with the risk that polymerization will contaminate the surface: "blooming"). Conversely, it has been found that when the temperature and relative humidity are too high, polymerization of the glue is too rapid, which also entails the risk of separation and moreover has the disadvantage of fouling and clogging the needle used for dispensing the glue. Also, it has been found that when the relative humidity is too low there are risks of static electricity. Static electricity has the disadvantage of strongly attracting drops of cyanoacrylate glue which can be deposited randomly and generate defects.

According to one preferred characteristic of the method of the invention, the glue is deposited in the form of at least five glue dots, at least one central dot composed of a drop known as central drop weighing between 0.002 and 0.004 gram, and at least four lateral dots, each lateral dot composed of a drop of glue known as lateral drop weighing between 0.0005 and 0.0015 gram. With these values, the module holds well until the pressing step.

In the example, optimum holding was obtained with only five dots and a quantity corresponding essentially to a weight of 0.003 gram for the central dot and approximately 0.001 gram for each lateral dot.

Deposition in dots is preferred over deposition in a bead because it is easier to implement on an industrial scale at high speeds. The number of five, and a particular preferred trace for the glue dots, ensures good adhesion of the module. The number of five dots is also more convenient and faster in use, in view of the total quantity of glue to be dispensed.

An example of an optimum trace is illustrated in FIG. 5. It has a central dot 11a in the location of the chip, and four other dots 12a to 15a, known as lateral dots, in the location of the contact pads and in the corners of the rectangle schematically representing the cavity. Other glue dot traces are also possible.

The steps of the process will now be described with reference to one embodiment as illustrated in FIGS. 7 to 11.

In the example, FIGS. 7 to 12 can represent both the steps of the process and the successive operating stations of a system as described below.

At a first station (FIG. 7) and in a first step a), first a drop of glue 11b is deposited in the center of the cavity with dispensing means 16, then the card is transferred to the next station (FIG. 8).

At this station, and in a second step b), four drops of cyanoacrylate glue 12b to 14b, known as lateral drops, are deposited in the four corners of the upper hollow with the aid of other dispensing means 17 and 18, and the card is transferred to a station known as an insertion station (FIG. 9).

At the insertion station, according to another method step c), an electronic module 5 is inserted with insertion means 19, applying a slight pressure known as insertion pressure. In this example the insertion time is 300 ms.

Better holding is obtained with a longer insertion time, for example 500 ms. The card is then transferred to the pressing station (FIG. 10 or, according to a preferred alternative, FIG. 11).

At the pressing station (FIG. 10), according to another method step d), the gluing means are pressed, applying a force of approximately 34 daN for 22 seconds using pressing means acting on the entire area of the module.

According to the preferred alterative (FIG. 11) and another characteristic of the method, pressing is done only at the periphery of the contact pads using pressing means 20b, which has the advantage of pressing the glue properly with no risk of introducing mechanical stresses that could damage the semiconductor chip or the connecting leads. Suitable pressing means are described below in relation to FIG. 12.

As explained above, the coating resin elevation 10 of the module 5 may have slightly varying thicknesses. In extreme cases, the elevation of the coating 10 may abut the bottom of the cavity and hence create a central point of the module that is slightly higher than the contact pads, which are flush with the surface of the card body. Such configurations, frequently encountered in industrial manufacturing, prohibit application of the pressure necessary for good-quality adhesion.

In the example, a force of 34 daN was distributed only over the peripheral area of the contact pads that abuts the first hollow.

In the next step, the card is evacuated, which completes the insertion operation.

According to another characteristic of the method, it includes a step in which the surface of the module is treated in such a way as to initiate polymerization of the glue when it comes in contact with the module.

Other treatments known to the individual skilled in the art can also be used.

For convenience, and due to the good immediate adhesion of the glue to the module, the lower surface of the module is moistened with alcohol prior to insertion of the module into the cavity. 95% ethyl alcohol gave good initiation results.

This operation allows glue polymerization to be initiated immediately and locally when the polyimide contacts the alcohol, and artificially creates adhesion points that hold the module still more firmly as it is transferred.

To be sure of having sufficient adhesion points and to hold the module correctly, it is advantageous to adjust the module insertion time as explained above. The insertion time is deliberately limited to 600 ms as the maximum value to preserve industrial compatibility at high speeds.

Moistening with alcohol also artificially reestablishes the difference in surface moisture between an ABS card surface and a polyimide module film surface which would have led to a difference in adhesion. This is because ABS has a different hydrophilic behavior from polyimide. ABS stores water molecules at the surface, while polyimide stores them in the interior. As water is a parameter that affects glue activation, it is preferable to initiate polymerization at the surface of the film so that eventually the level of glue adhesion is as good on the module as on the card.

Figure 13:
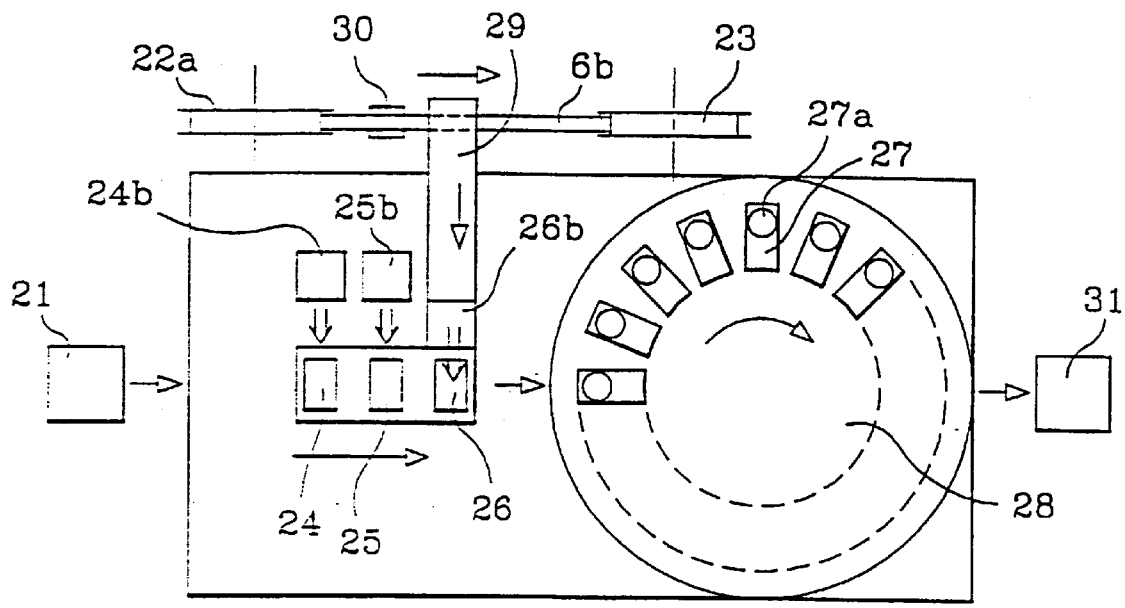
FIG. 13 is a top view of an example of a system for carrying out the method at very high speed.
Figure 12:
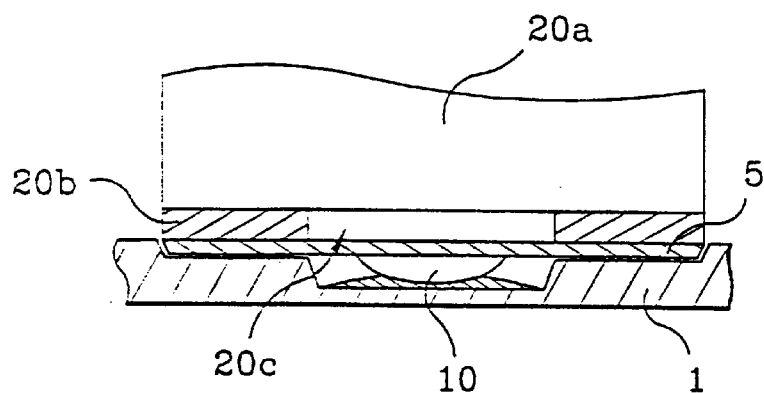
FIG. 12 represents pressing means.
Figure 14:
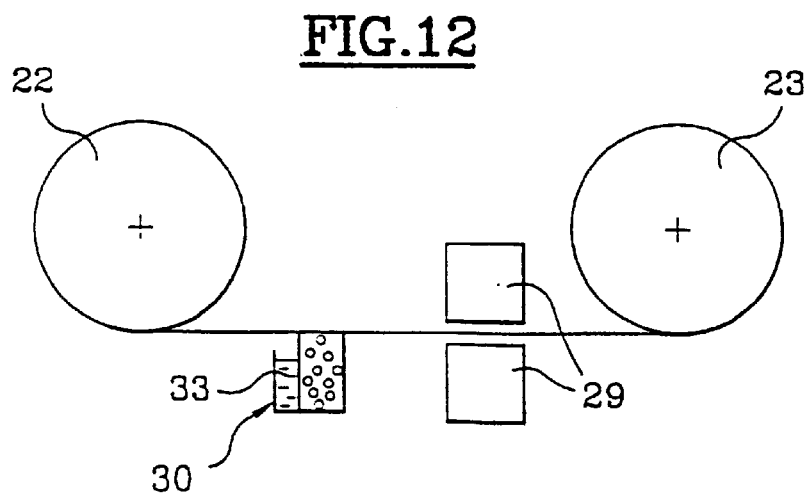
FIG. 14 shows the alcohol moistening means.

One example of a system for high-speed industrial implementation of the method according to the invention will now be described with reference to FIG. 13.

The system has card supply means 21 for supplying a plurality of card bodies, module supply means 22, 23 for supplying a plurality of modules, a first station 24 dispensing one drop of glue equipped with dispensing means 24b having a needle 16, a second station 25 dispensing four drops of glue equipped with dispensing means 25b having two needles 17 and 18, a module insertion station 26 equipped with insertion means 26b, pressing stations 27 equipped with pressing means disposed at the periphery of a carousel 28 which supports the cards during the pressing time, means 29 for cutting up the modules and transferring them to the insertion station, means 30 for moistening with alcohol if appropriate, then removal means 31. The system also includes an enclosure with controlled temperature and relative humidity (not shown).

The module supply means are two rolls, a first roll 22 loaded with a film 6 supporting the modules and a second roll 23 supporting a film from which modules are absent, one paying out while the other winds up. If appropriate, the film passes by means 30 for moistening with alcohol described hereinbelow before passing by module cutting means 29.

The modules are extracted from this film by the cutting means and guided by the transfer means to the insertion station where they are inserted in a centered manner in the cavity of each card.

The means 30 for moistening the lower surface of the module with alcohol are in this example a sponge 32 dipping into a bath 33 of ethyl alcohol in a container. The sponge is kept continuously in contact with the module supply film.

The needles of the glue dispensing means are movable vertically and transversely.

Each pressing station 27 is provided with pressing means 27a having a vertically movable end 20a (FIG. 12) that comes in contact with the module. To implement pressing according to the method, this end is provided with a blanket 20b with a hole in the middle so that pressure can be applied only to the periphery of the module. The blanket is made of a material able to distribute the pressure without affecting the contact pads, an elastomer for example, and is rectangular in shape, corresponding to the shape of the module.

Operation

When a card arrives at each dispensing station, the needles are positioned above the location of the glue dots corresponding to the intended trace (FIG. 5) then descend to near the surface of the cavity, and a control system (not shown) causes predetermined quantities of glue to be delivered; the needles then rise in such a way as to break off a filament of residual resin that tends to cling to the needle and return to the standby position awaiting the next card. They are set to allow descent, dispensing, and rising in 1.5 seconds.

The cards are then transferred to the insertion station where they receive a module, the insertion time being 500 ms.

The cards are then transferred to the pressing station where the module is pressed against the card body, the force applied being 34 daN. They stay on the carousel for 22 seconds and are then ejected to the next station.

As they leave the carrousel, the cards may be tested and sent to removal means 31.

The means moving the cards from one station to the next are mechanized to give a rate of at least 1500 cards per hour.

What is claimed is:

1. Method for making electronic module cards of the type having a card body with a cavity, an electronic module whose dimensions fit into said cavity, and a cyanoacrylate glue, and having steps wherein said glue is deposited in said cavity, said module is inserted into the cavity in a substantially centered position, and said glue is pressed between the body and the module, characterized in that:

said glue is deposited in a quantity enablingy only a partial gluing area of at least 50% of the area of said cavity after pressing, at a temperature of 15 to 30° C. and a relative humidity of 50 to 75%; and said quantity of glue is deposited in a pattern with a central dot and at least four lateral dots wherein the central dot is larger than each of the at least four lateral dots.

2. Method according to claim 1, characterized in that said gluing area is between 60 and 80% and the temperature is between 18 and 24° C.

3. Method according to claim 2, characterized in that said gluing area is approximately 70%, the temperature is approximately 20° C., and the relative humidity is approximately 55%.

4. Method according to claim 1, characterized in that insertion takes place in a time period of between 300 and 600 ms.

5. Card obtained by implementing the method according to claim 1.

6. Method for making electronic module cards of the type having a card body with a cavity, an electronic module whose dimensions fit into said cavity, and a cyanoacrylate glue, and having steps wherein said glue is deposited in said cavity, said module is inserted into the cavity in a substantially centered position, and said glue is pressed between the body and the module, characterized in that:

said glue is deposited in a quantity enabling only a partial gluing area of at least 50% of the area of said cavity, after pressing, at a temperature of 15 to 30° C. and a relative humidity of 50 to 75%; and said quantity of glue is deposited in the form of at least five glue dots, a central dot composed of a dot weighing between 0.002 and 0.004 gram, and at least four lateral dots, each weighing between 0.0005 and 0.0015 gram.

7. Method according to claim 6, characterized in that the weights of the central drop and of each lateral drop are equal to approximately 0.003 and 0.001 gram, respectively.

8. Method according to claim 6, characterized in that the at least four glue dots are deposited after deposition of the central glue dot and just before insertion of the module.

9. Method for making electronic module cards of the type having a card body with a cavity, an electronic module whose dimensions fit into said cavity, and a cyanoacrylate glue, and having steps wherein said glue is deposited in said cavity, said module is inserted into the cavity in a substantially centered position, and said glue is pressed between the body and the module, characterized in that:

said glue is deposited in a quantity enabling only a partial gluing area of at least 50% of the area of said cavity, after pressing, at a temperature of 15 to 30° C. and a relative humidity of 50 to 75%; and said quantity of glue is deposited in the form of at least five glue dots, comprising a central dot, and at least four lateral dots, the central dot weighing approximately three times the weight of each of said at least four lateral dots.

10. Method according to claim 9, characterized in that the at least four glue dots are deposited after deposition of the central glue dot and just before insertion of the module.

11. Card obtained by implementing the method according to claim 9.

12. Method for making electronic module cards of the type having a card body with a cavity, an electronic module whose dimensions fit into said cavity, and a cyanoacrylate glue, and having steps wherein said glue is deposited in said cavity, said module is inserted into the cavity in a substantially centered position, and said glue is pressed between the body and the module, characterized in that:

said glue is deposited in a quantity enablingy only a partial gluing area of at least 50% of the area of said cavity after pressing, at a temperature of 15 to 30° C. and a relative humidity of 50 to 75%;

said quantity of glue is deposited in a pattern with a central dot and at least four lateral dots wherein the central dot is larger than each of the at least four lateral dots; and the pressing is effected by a blanket with a central hole, which is disposed between the module and the pressing means, whereby pressing is done only at the periphery of said module and thus reducing the risk of introducing mechanical stress to the module that could damage its semiconductor chip or its connecting leads.

13. The method according to claim 12 wherein a force of 34 daN is distributed only over said peripheral area.

* * * * *